(12) United States Patent
Lee

(10) Patent No.: US 12,334,371 B2
(45) Date of Patent: Jun. 17, 2025

(54) REMOTE MONITORING APPARATUS FOR AIR VALVE FOR SEMICONDUCTOR EQUIPMENT

(71) Applicant: SPSGLOBAL Co., Ltd, Cheonan-si (KR)

(72) Inventor: Sang Hyub Lee, Cheonan-si (KR)

(73) Assignee: SPSGLOBAL Co., Ltd, Cheonan-si (KR)

( * ) Notice: Subject to any disclaimer, the term of this patent is extended or adjusted under 35 U.S.C. 154(b) by 746 days.

(21) Appl. No.: 17/518,917

(22) Filed: Nov. 4, 2021

(65) Prior Publication Data

US 2023/0126604 A1   Apr. 27, 2023

(51) Int. Cl.
| | |
|---|---|
| H01L 21/67 | (2006.01) |
| G01M 3/24 | (2006.01) |
| G01M 3/26 | (2006.01) |
| G01M 3/38 | (2006.01) |
| G06N 20/00 | (2019.01) |

(52) U.S. Cl.
CPC ......... *H01L 21/67242* (2013.01); *G01M 3/24* (2013.01); *G01M 3/26* (2013.01); *G01M 3/38* (2013.01); *G06N 20/00* (2019.01)

(58) Field of Classification Search
None
See application file for complete search history.

(56) References Cited

U.S. PATENT DOCUMENTS

2020/0050221 A1* 2/2020 Hiramatsu .............. F16L 55/07

FOREIGN PATENT DOCUMENTS

JP       2004363522 A   * 12/2004

OTHER PUBLICATIONS

English machine translation of JP 2004363522 A (Year: 2004).*

* cited by examiner

*Primary Examiner* — Walter L Lindsay, Jr.
*Assistant Examiner* — Geoffrey T Evans
(74) *Attorney, Agent, or Firm* — United One Law Group LLC; Kongsik Kim; Jhongwoo Peck

(57) ABSTRACT

Disclosed herein is a remote monitoring apparatus for an air valve for semiconductor equipment. The remote monitoring apparatus includes: a communication network formed by selecting one or more from the Internet, a Bluetooth network, a Wi-Fi network, and an Internet of Things (IoT) network and then combining them, and configured to connect a device, a server, and a terminal; an inspection device installed on one side of an air valve for semiconductor equipment; a management server connected to the communication network, and configured to collectively manage failure diagnosis and monitoring information; and an operator terminal configured to output the failure diagnosis and monitoring information.

8 Claims, 5 Drawing Sheets

REMOTE MONITORING APPARATUS FOR AIR VALVE FOR SEMICONDUCTOR EQUIPMENT

CROSS-REFERENCE TO RELATED APPLICATION

This application claims priority to Korean Application No. 10-2021-0143340 filed on Oct. 26, 2021, which is incorporated herein by reference in its entirety.

BACKGROUND

1. Technical Field

The present invention relates generally to a remote monitoring apparatus for an air valve for semiconductor equipment, and more particularly to a remote monitoring apparatus for an air valve for semiconductor equipment that generates a deep learning solution to the determination of the leakage of an air valve by performing deep learning using the audio data, pressure data, image data, displacement data, infrared data, and ultrasonic data of the air valve by means of machine learning software using a neural network compiler operating in the terminal MCU of each inspection device, allows the inspection device to form a distributed cloud, diagnoses a failure by sensing the audio data, pressure data, image data, displacement data, infrared data, and ultrasonic data of the air valve and then analyzing the sensed data, generates a leakage signal when a leakage of the air valve occurs, and transmits the generated leakage signal and data, obtained by analyzing the audio data, pressure data, image data, displacement data, infrared data, and ultrasonic data of the air valve, to a management server and an operator terminal over a communication network configured by selecting one or more from the Internet, a Bluetooth network, a Wi-Fi network, and an Internet of Things (IoT) network and then combining them, thereby allowing the air valve to be monitored at a remote location.

2. Description of the Related Art

A conventional air leakage inspection apparatus for an air valve for semiconductor equipment injects helium directly into a section where a leakage occurs and determines the leakage of air depending on whether helium is detected. The conventional air leakage inspection apparatus is problematic in that it has to consume helium gas, in that it is difficult to perform accurate leakage inspection because the leakage of air is determined using one type of sensor, and in that an administrator needs to check for a leakage by directly operating the inspection apparatus.

Furthermore, a conventional self-learning device is problematic in that it consumes a lot of power and in that it is difficult to apply the conventional self-learning device to a terminal device because it employs a System on Chip (SoC) with large memory capacity.

Moreover, the conventional self-learning device is also problematic in that since the self-learning device is located in a management server, it is difficult to rapidly process information due to a communication bottleneck when a lot of data is gathered to the management server or a lot of equipment is used.

RELATED ART DOCUMENTS

Patent document 1: KR 10-2018-0060461 A (published on Jun. 7, 2018)

Patent document 2: KR 10-2084155 B1 (published on Feb. 26, 2020)

SUMMARY

The present invention has been conceived to overcome the above-described problems, and an object of the present invention is to provide a remote monitoring apparatus for an air valve for semiconductor equipment that generates a deep learning solution by performing deep learning using the audio data, pressure data, image data, displacement data, infrared data, and ultrasonic data of an air valve by means of machine learning software using a neural network compiler operating in the terminal MCU of each inspection device, allows the inspection device to form a distributed cloud, diagnoses a failure by sensing the audio data, pressure data, image data, displacement data, infrared data, and ultrasonic data of the air valve and then analyzing the sensed data, generates a leakage signal when a leakage of the air valve occurs, and transmits the generated leakage signal and data, obtained by analyzing the audio data, pressure data, image data, displacement data, infrared data, and ultrasonic data of the air valve, to a management server and an operator terminal over a communication network configured by selecting one or more from the Internet, a Bluetooth network, a Wi-Fi network, and an Internet of Things (IoT) network and then combining them, thereby allowing the air valve to be monitored at a remote location.

In order to accomplish the above object, the present invention provides a remote monitoring apparatus for an air valve for semiconductor equipment, the remote monitoring apparatus including: a communication network formed by selecting one or more from the Internet, a Bluetooth network, a Wi-Fi network, and an Internet of Things (IoT) network and then combining them, and configured to connect a device, a server, and a terminal; an inspection device installed on one side of an air valve for semiconductor equipment; a management server connected to the communication network, and configured to collectively manage failure diagnosis and monitoring information; and an operator terminal configured to output the failure diagnosis and monitoring information.

The inspection device may include: an inspection device body installed on one side of the air valve; a sensor unit installed on one side of the inspection device body, and configured to sense the audio data, pressure data, image data, displacement data, infrared data, and ultrasonic data of the air valve; and an MCU installed inside the inspection device body.

The sensor unit may include: an audio sensor installed inside the inspection device body, and configured to sense the audio data of the air valve; a pressure sensor installed on one side of the inspection device body, and configured to sense the pressure data of the air valve; an image sensor installed outside the inspection device body, and configured to sense the image data of the air valve; a displacement sensor installed outside the inspection device body, and configured to sense the displacement data of the air valve; an infrared sensor installed outside the inspection device body, and configured to sense the infrared data of the air valve; and an ultrasonic sensor installed outside the inspection device body, and configured to sense the ultrasonic data of the air valve.

The MCU may include: a data collection unit configured to collect the audio data, the pressure data, the image data, the displacement data, the infrared data, and the ultrasonic data sensed by the sensor unit; a data analysis configured to preprocess the data collected by the data collection unit, and to divide and analyze the preprocessed data; a data storage unit configured to store the data analyzed by the data analysis unit; a self-learning unit configured to generate a deep learning solution by performing deep learning using the data stored in the data storage unit; a deep learning solution storage unit configured to store the deep learning solution generated by the self-learning unit; and a leakage determination unit configured to determine a leak of the air valve based on each of the audio data, pressure data, image data, displacement data, infrared data, and ultrasonic data of the air valve by using the deep learning solution stored in the deep learning solution storage unit, to assign weights to leaks of the air valve determined based on the respective pieces of data, to determine the leakage of the air valve based on the sum of the weights, and to generate a leakage signal.

The leakage determination unit may generate the leakage signal when the sum of the weights is 10 or more by assigning a weight of 2 when a leak is determined based on the audio data, assigning a weight of 6 when a leak is determined based on the pressure data, assigning a weight of 1 when a leak is determined based on the image data, assigning a weight of 4 when a leak is determined based on the displacement data, assigning a weight of 6 when a leak is determined based on the infrared data, and assigning a weight of 1 when a leak is determined based on the ultrasonic data.

The self-learning unit may generate the deep learning solution to the determination of the leakage of the air valve by performing deep learning using the audio data, the pressure data, the image data, the displacement data, the infrared data, and the ultrasonic data by means of machine learning software using a neural network compiler that operates in the MCU.

The deep learning solution may be stored in the deep learning solution storage unit of the MCU and form a distributed cloud.

The operator terminal may include: a terminal reception unit configured to receive the leakage signal generated by the leakage determination unit and data obtained through the analysis of the data analysis unit; a screen output unit configured to output the leakage signal and the data, received by the terminal reception unit, as images; and an audio output unit configured to output the leakage signal, received by the terminal reception unit, as audio data.

The remote monitoring apparatus may perform a remote monitoring method, and the remote monitoring method may include: a first step of sensing each of the audio data, pressure data, image data, displacement data, infrared data, and ultrasonic data of the air valve and transmitting it to the data collection unit of the MCU; a second step of preprocessing each of the audio data, the pressure data, the image data, the displacement data, the infrared data, and the ultrasonic data, sensed at the first step, in the data analysis unit; a third step of dividing the audio data, the pressure data, the image data, the displacement data, the infrared data, and the ultrasonic data, preprocessed at the second step, in the data analysis unit; a fourth step of analyzing each of the audio data, the pressure data, the image data, the displacement data, the infrared data, and the ultrasonic data, divided at the third step, in the data analysis unit; a fifth step of storing the audio data, the pressure data, the image data, the displacement data, the infrared data, and the ultrasonic data, analyzed at the fourth step, in the data storage unit; a sixth step of generating a deep learning solution to the determination of the leakage of the air valve based on the audio data, the pressure data, the image data, the displacement data, the infrared data, and the ultrasonic data, stored at the fifth step, in the self-learning unit of the MCU; a seventh step of storing the deep learning solution, generated at the sixth step, in the deep learning solution storage unit; an eighth step of determining a leak of the air valve based on each of the audio data, the pressure data, the image data, the displacement data, the infrared data, and the ultrasonic data, analyzed at the fourth step, by using the deep learning solution stored at the seventh step, and generating a leakage signal when the sum of the weights is 10 or more by assigning a weight of 2 when a leak is determined based on the audio data, assigning a weight of 6 when a leak is determined based on the pressure data, assigning a weight of 1 when a leak is determined based on the image data, assigning a weight of 4 when a leak is determined based on the displacement data, assigning a weight of 6 when a leak is determined based on the infrared data, and assigning a weight of 1 when a leak is determined based on the ultrasonic data; a ninth step of transmitting the leakage signal, generated at the eighth step, to the management server and the operator terminal; and a tenth step of outputting the leakage signal transmitted at the ninth step and the data analyzed at the fourth step as images in the screen output unit of the operator terminal and as audios in the audio output unit.

BRIEF DESCRIPTION OF THE DRAWINGS

The above and other objects, features, and advantages of the present invention will be more clearly understood from the following detailed description taken in conjunction with the accompanying drawings, in which.

DETAILED DESCRIPTION

In order to describe the present invention in detail to such an extent that those of ordinary skill in the art to which the present invention pertains can easily implement the technical spirit of the present invention, embodiments of the present invention will be described with reference to the accompanying drawings below.

However, the following embodiments are merely examples intended to help the understanding of the present invention, and the scope of the present invention is not reduced or limited by the embodiments. Furthermore, the present invention may be embodied in various different forms, and is not limited to the embodiments described herein.

Figure 1:
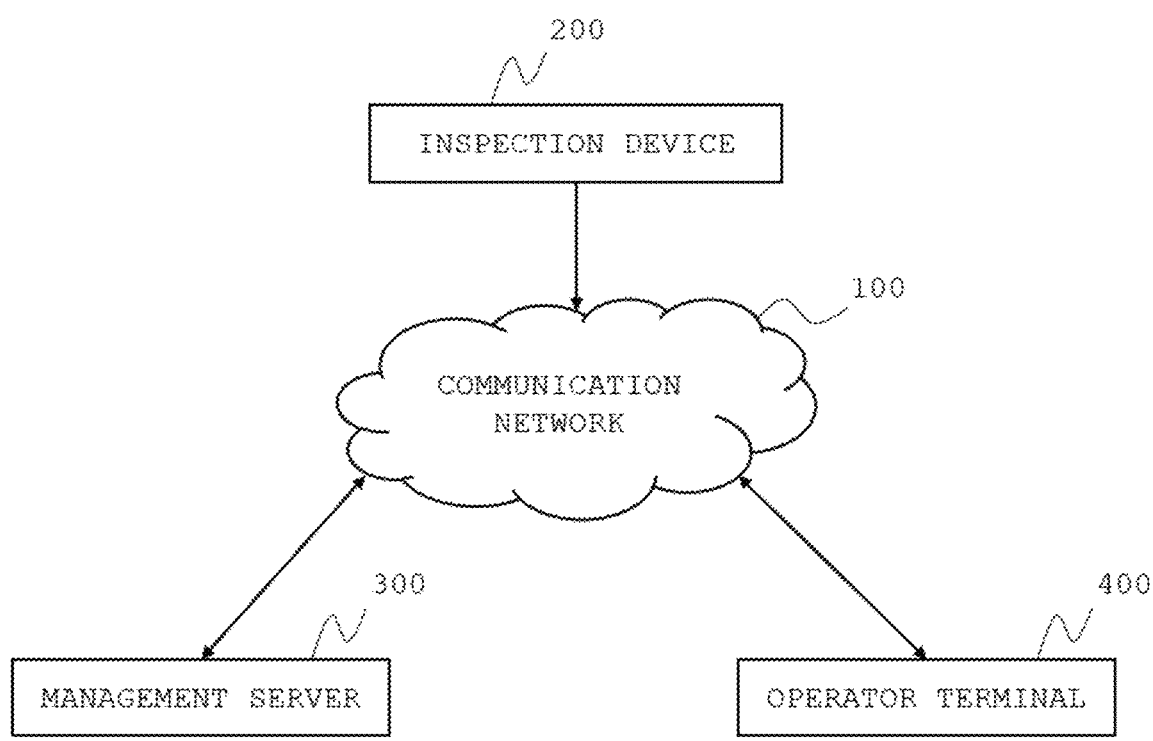
FIG. 1 is a block diagram showing a remote monitoring apparatus for an air valve for semiconductor equipment according to an embodiment of the present invention.

FIG. 1 is a block diagram showing a remote monitoring apparatus for an air valve for semiconductor equipment according to an embodiment of the present invention.

Referring to FIG. 1, the remote monitoring apparatus for an air valve for semiconductor equipment may include a communication network 100, an inspection device 200, a management server 300, and an operator terminal 400.

In this case, the communication network 100 may be any one communication network configured by selecting one or more from the Internet, a Bluetooth network, a Wi-Fi network, and an Internet of Things (IoT) network and then combining them.

Figure 2:
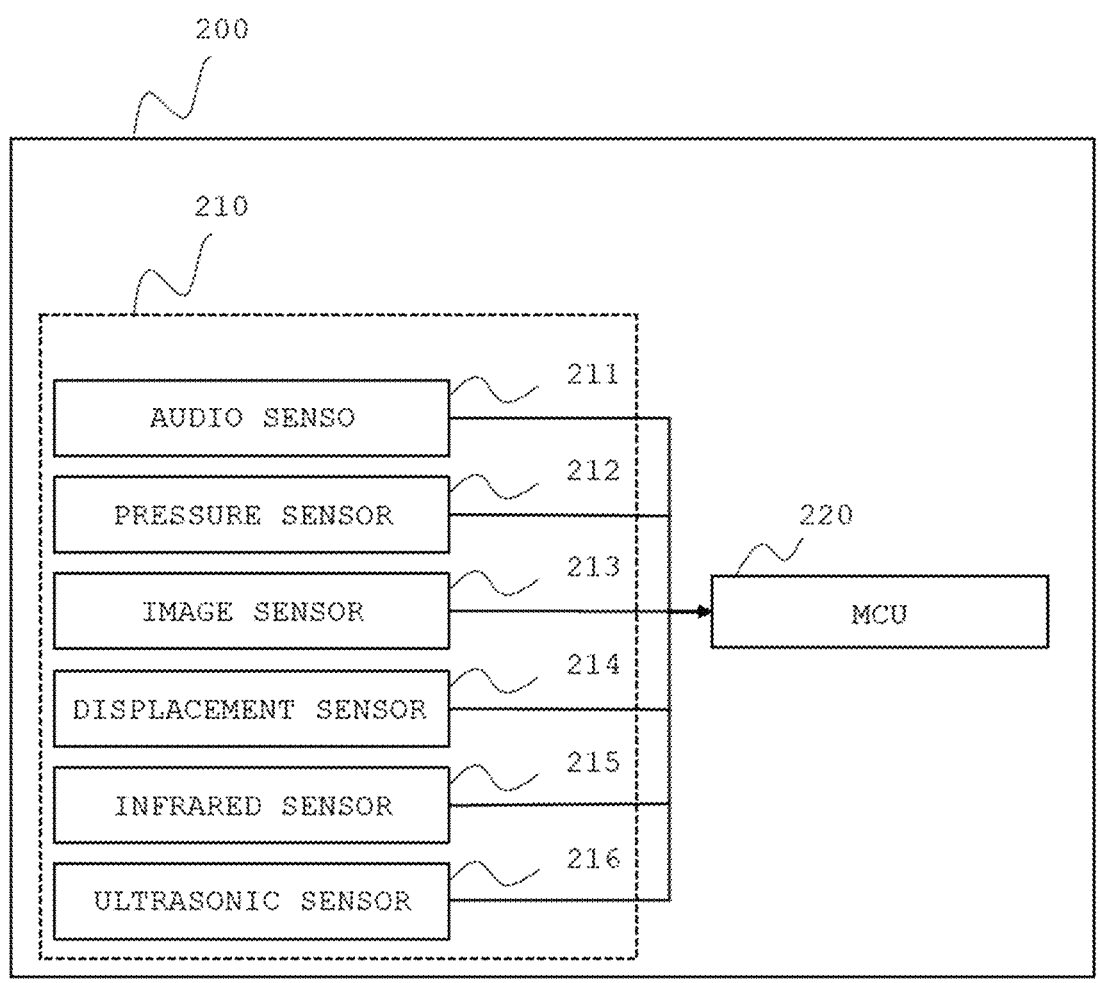
FIG. 2 is a detailed block diagram showing an inspection device in the remote monitoring apparatus for an air valve for semiconductor equipment according to the embodiment of the present invention.

FIG. 2 is a detailed block diagram showing the inspection device in the remote monitoring apparatus for an air valve for semiconductor equipment according to the embodiment of the present invention.

Referring to FIG. 2, the inspection device 200 includes: an inspection device body (not shown) installed on one side of an air valve (not shown) for semiconductor equipment; a sensor unit 210 installed on one side of the inspection device body (not shown), and configured to sense audio data, pressure data, image data, displacement data, infrared data, and ultrasonic data generated by the air valve (not shown); and an MCU 220 installed inside the inspection device body (not shown).

In this case, the sensor unit 210 may be installed inside the inspection device body (not shown), and may include an audio sensor 211, a pressure sensor 212, an image sensor 213, a displacement sensor 214, an infrared sensor 215, and an ultrasonic sensor 216.

Figure 3:
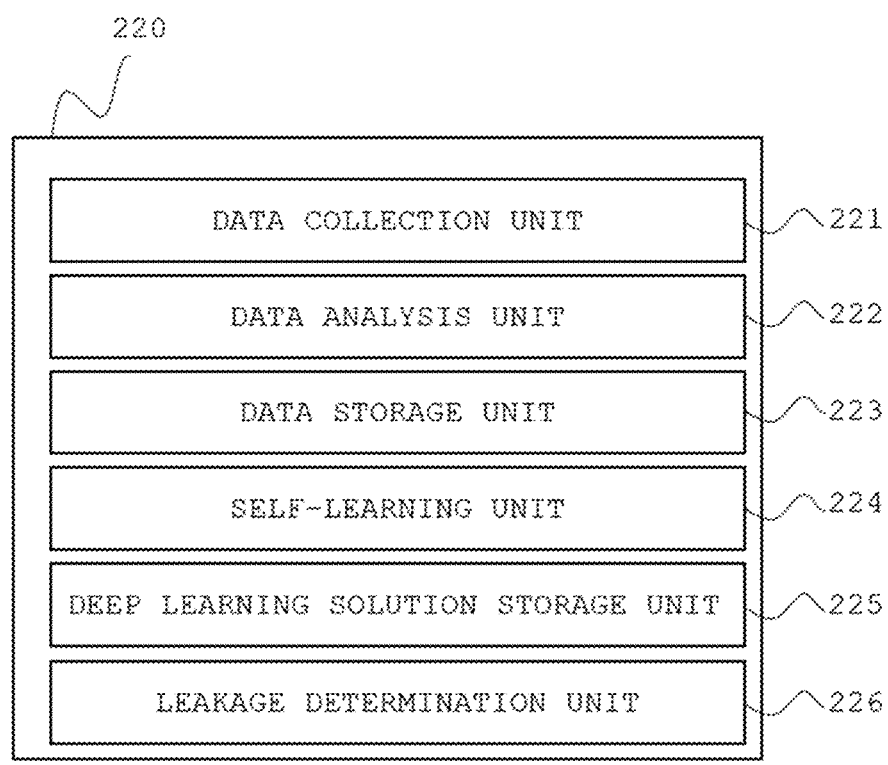
FIG. 3 is a detailed block diagram showing an MCU in the remote monitoring apparatus for an air valve for semiconductor equipment according to the embodiment of the present invention.

FIG. 3 is a detailed block diagram showing the MCU in the remote monitoring apparatus for an air valve for semiconductor equipment according to the embodiment of the present invention.

Referring to FIG. 3, the MCU 220 includes: a data collection unit 221 configured to collect data sensed by the sensor unit 210; a data analysis unit 222 configured to analyze the data collected by the data collection unit 221; a data storage unit 223 configured to store the data analyzed by the data analysis unit 222; a self-learning unit 224 configured to generate a deep learning solution by performing deep learning using the data stored in the data storage unit 223; a deep learning solution storage unit 225 configured to store the deep learning solution generated by the self-learning unit 224; and a leakage determination unit 226 configured to determine a leak of the air valve (not shown) based on each of the audio data, pressure data, image data, displacement data, infrared data, and ultrasonic data of the air valve (not shown) by using the deep learning solution stored in the deep learning solution storage unit 225, to assign weights to the leaks of the air valve determined based on the respective pieces of data, to determine the leakage of the air valve (not shown) based on the sum of the weights, and to generate a leakage signal.

The leakage signal generated based on the sum of the weights by the leakage determination unit 226 needs to have high accuracy.

Experimental Example 1: Accuracy of Leakage Signal According to Weight Setting

The audio sensor 211, the pressure sensor 212, the image sensor 213, the displacement sensor 214, the infrared sensor 215, and the ultrasonic sensor 216 generally used in a semiconductor process were used, weights were assigned, leaks of the air valve (not shown) were determined, and the accuracy of each of the leakage signals generated based on the determined leaks was measured 200 times.

TABLE 1

Accuracies of leakage signals generated when sum of weights according to weight setting is 10

|  | Example 1 | Example 2 | Example 3 | Example 4 | Example 5 |
|---|---|---|---|---|---|
| Audio sensor | 2 | 5 | 2 | 6 | 3 |
| Pressure sensor | 2 | 5 | 6 | 2 | 3 |
| Image sensor | 2 | 5 | 1 | 6 | 3 |
| Displacement sensor | 2 | 5 | 4 | 2 | 3 |
| Infrared sensor | 2 | 5 | 6 | 2 | 6 |
| Ultrasonic sensor | 2 | 5 | 1 | 6 | 6 |
| Accuracy (%) | 76 | 87 | 98 | 77 | 82 |

Therefore, the leakage determination unit 226 of the MCU 220 of the inspection device 200 preferably generates a leakage signal when the sum of the weights is 10 or more by assigning a weight of 2 when a leak is determined based on the audio data, assigning a weight of 6 when a leak is determined based on the pressure data, assigning a weight of 1 when a leak is determined based on the image data, assigning a weight of 4 when a leak is determined based on the displacement data, assigning a weight of 6 when a leak is determined based on the infrared data, and assigning a weight of 1 when a leak is determined based on the ultrasonic data, as shown in example 3.

In this case, the leakage signal may be generated when the sum of the weights is 10 or more by assigning a weight of 2 when a leak is determined based on the audio data, assigning a weight of 6 when a leak is determined based on the pressure data, assigning a weight of 1 when a leak is determined based on the image data, assigning a weight of 4 when a leak is determined based on the displacement data, assigning a weight of 6 when a leak is determined based on the infrared data, and assigning a weight of 1 when a leak is determined based on the ultrasonic data.

In addition, the self-learning unit 224 may generate the deep learning solution to the determination of the leakage of the air valve by performing deep learning using the audio data, the pressure data, the image data, the displacement data, the infrared data, and the ultrasonic data by means of machine learning software using a neural network compiler that operates in the MCU.

Furthermore, the deep learning solution may be stored in the deep learning solution storage unit 225 of the MCU 220, and may form a distributed cloud.

Figure 4:
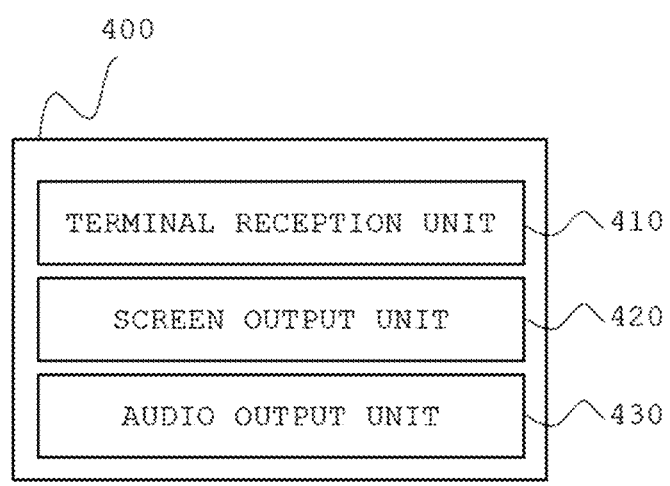
FIG. 4 is a detailed block diagram showing an operator terminal in the remote monitoring apparatus for an air valve for semiconductor equipment according to the embodiment of the present invention.

FIG. 4 is a detailed block diagram showing the operator terminal in the remote monitoring apparatus for an air valve for semiconductor equipment according to the embodiment of the present invention.

Referring to FIG. 4, the operator terminal 400 may include: a terminal reception unit 410 configured to receive the leakage signal generated by the leakage determination unit 226 and the data analyzed by the data analysis unit 222; a screen output unit 420 configured to output the leakage signal and the analyzed data, received by the terminal reception unit 410, as images; and an audio output unit 430 configured to output the leakage signal, received by the terminal reception unit 410, as audio data.

Figure 5:
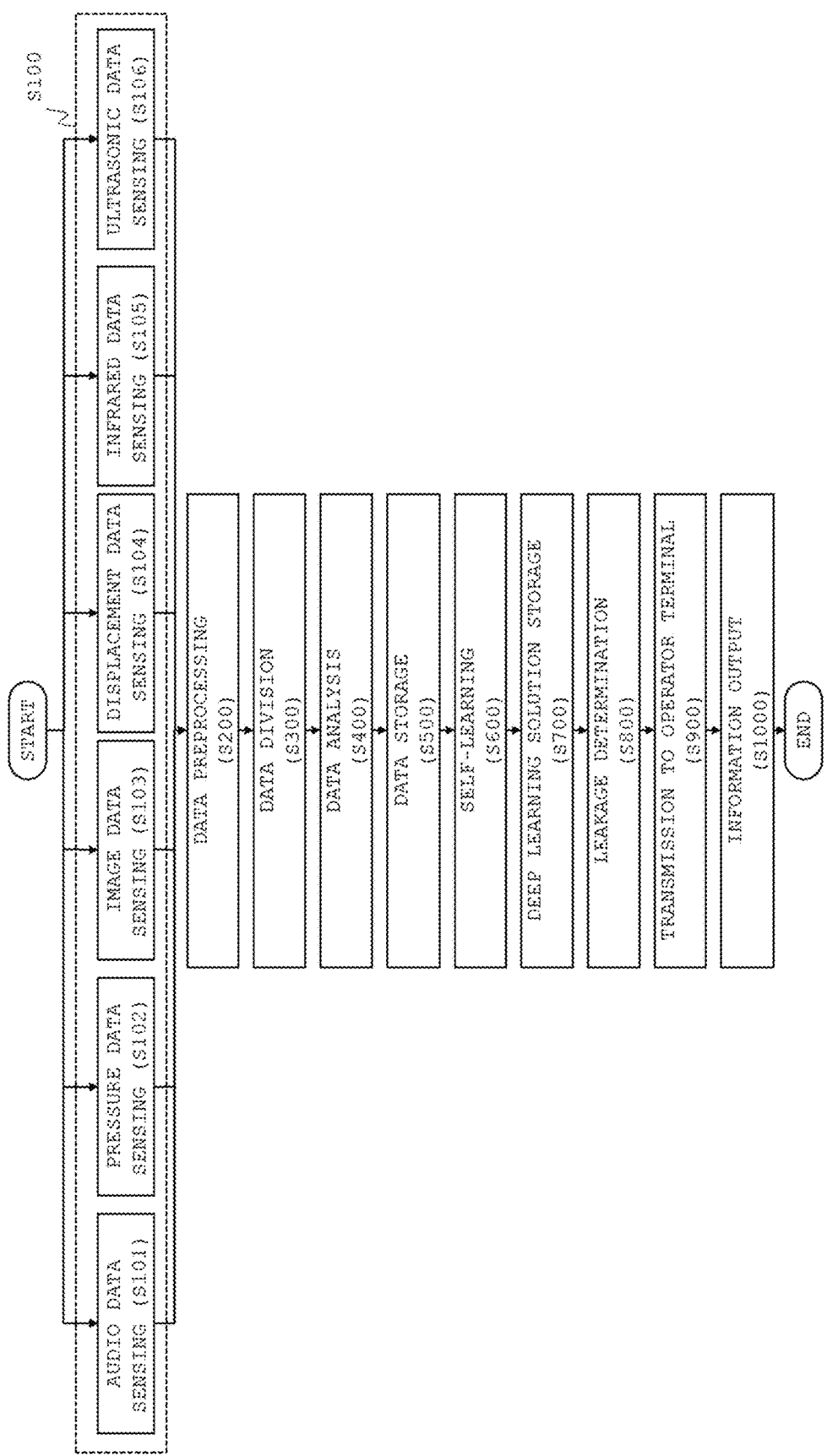
FIG. 5 is a flowchart showing a remote monitoring method of a remote monitoring apparatus for an air valve for semiconductor equipment according to an embodiment of the present invention.

FIG. 5 is a flowchart showing a remote monitoring method of a remote monitoring apparatus for an air valve for semiconductor equipment according to an embodiment of the present invention.

Referring to FIG. 5, the monitoring method of a remote monitoring apparatus for an air valve for semiconductor equipment may include: a first step S100 of sensing each of the audio data, pressure data, image data, displacement data, infrared data, and ultrasonic data of an air valve (not shown) and transmitting it to the data collection unit 221 of the MCU 220; a second step S200 of preprocessing each of the audio data, the pressure data, the image data, the displacement data, the infrared data, and the ultrasonic data, sensed at the first step S100, in the data analysis unit 222; a third step S300 of dividing the audio data, the pressure data, the image data, the displacement data, the infrared data, and the ultrasonic data, preprocessed at the second step S200, in the data analysis unit 222; a fourth step S400 of analyzing each of the audio data, the pressure data, the image data, the displacement data, the infrared data, and the ultrasonic data, divided at the third step S300, in the data analysis unit 222; a fifth step S500 of storing the audio data, the pressure data, the image data, the displacement data, the infrared data, and the ultrasonic data, analyzed at the fourth step S400, in the data storage unit 223; a sixth step S600 of generating a deep learning solution based on the audio data, the pressure data, the image data, the displacement data, the infrared data, and the ultrasonic data, stored at the fifth step S500, in the self-learning unit 224 of the MCU 220; a seventh step S700 of storing the deep learning solution, generated at the sixth step S600, in the deep learning solution storage unit 225; an eighth step S800 of determining a leak of the air valve (not shown) based on each of the audio data, the pressure data, the image data, the displacement data, the infrared data, and the ultrasonic data, analyzed at the fourth step S400, by using the deep learning solution stored at the seventh step S700, and generating a leakage signal when the sum of the weights is 10 or more by assigning a weight of 2 when a leak is determined based on the audio data, assigning a weight of 6 when a leak is determined based on the pressure data, assigning a weight of 1 when a leak is determined based on the image data, assigning a weight of 4 when a leak is determined based on the displacement data, assigning a weight of 6 when a leak is determined based on the infrared data, and assigning a weight of 1 when a leak is determined based on the ultrasonic data; a ninth step S900 of transmitting the leakage signal, generated at the eighth step S800, to the management server 300 and the terminal reception unit 410 of the operator terminal 400; and a tenth step S1000 of outputting the leakage signal transmitted at the ninth step S900 and the data analyzed at the fourth step S400 as images in the screen output unit 420 of the operator terminal 400 and as audios in the audio output unit 430.

As described above, the present invention has a remote monitoring apparatus for an air valve for semiconductor equipment as its technical spirit. The embodiments described above with reference to the accompanying drawings are merely examples, and the true scope of the present invention is defined only based on the attached claims. However, it will also be extended to equivalent embodiments that may be present in various manners.

According to the remote monitoring apparatus for an air valve for semiconductor equipment according to the present invention, which is configured as described above, the following effects may be obtained:

In the remote monitoring apparatus for an air valve for semiconductor equipment, the audio data, pressure data, image data, displacement data, infrared data, and ultrasonic data of an air valve is sensed, a deep learning solution to the determination of the leakage of an air valve is generated by performing deep learning using the audio data, pressure data, image data, displacement data, infrared data, and ultrasonic data of the air valve by means of machine learning software using a neural network compiler operating in the terminal MCU of each inspection device, the inspection device forms a distributed cloud, a failure is diagnosed by sensing the audio data, pressure data, image data, displacement data, infrared data, and ultrasonic data of the air valve and then analyzing the sensed data, generates a leakage signal when a leakage of the air valve occurs, and the generated leakage signal and data, obtained by analyzing the audio data, pressure data, image data, displacement data, infrared data, and ultrasonic data of the air valve, are transmitted to a management server and an operator terminal over a communication network configured by selecting one or more from the Internet, a Bluetooth network, a Wi-Fi network, and an Internet of Things (IoT) network and then combining them, thereby allowing the air valve to be diagnosed and monitored at a remote location.

Although the present invention has been described with reference to the embodiments shown in the drawings, they are only examples. It will be apparent to those skilled in the art that various modifications and other equivalent embodiments may be made therefrom. Accordingly, the true technical protection range of the present invention should be defined by the technical spirit of the attached claims.

What is claimed is:

1. A remote monitoring apparatus for an air valve for semiconductor equipment, the remote monitoring apparatus comprising:
   a communication network formed by selecting one or more from an Internet, a Bluetooth network, a Wi-Fi network, and an Internet of Things (IoT) network and then combining them, and configured to connect a device, a server, and a terminal;
   an inspection device installed on one side of an air valve for semiconductor equipment;
   a management server connected to the communication network, and configured to collectively manage failure diagnosis and monitoring information; and
   an operator terminal configured to output the failure diagnosis and monitoring information,
   wherein the inspection device comprises:
      an inspection device body installed on one side of the air valve;
      a sensor unit installed on one side of the inspection device body, and configured to sense audio data, pressure data, image data, displacement data, infrared data, and ultrasonic data of the air valve; and
      a microcontroller unit (MCU) installed inside the inspection device body.

2. The remote monitoring apparatus of claim 1, wherein the sensor unit comprises:
   an audio sensor installed inside the inspection device body, and configured to sense the audio data of the air valve;
   a pressure sensor installed on one side of the inspection device body, and configured to sense the pressure data of the air valve;
   an image sensor installed outside the inspection device body, and configured to sense the image data of the air valve;
   a displacement sensor installed outside the inspection device body, and configured to sense the displacement data of the air valve;
   an infrared sensor installed outside the inspection device body, and configured to sense the infrared data of the air valve; and an ultrasonic sensor installed outside the inspection device body, and configured to sense the ultrasonic data of the air valve.

3. The remote monitoring apparatus of claim 1, wherein the MCU comprises:
- a data collection unit configured to collect the audio data, the pressure data, the image data, the displacement data, the infrared data, and the ultrasonic data sensed by the sensor unit;
- a data analysis configured to preprocess the data collected by the data collection unit, and to divide and analyze the preprocessed data;
- a data storage unit configured to store the data analyzed by the data analysis unit;
- a self-learning unit configured to generate a deep learning solution by performing deep learning using the data stored in the data storage unit;
- a deep learning solution storage unit configured to store the deep learning solution generated by the self-learning unit; and
- a leakage determination unit configured to determine a leak of the air valve based on each of the audio data, pressure data, image data, displacement data, infrared data, and ultrasonic data of the air valve by using the deep learning solution stored in the deep learning solution storage unit, to assign weights to leaks of the air valve determined based on the respective pieces of data, to determine a leakage of the air valve based on a sum of the weights, and to generate a leakage signal.

4. The remote monitoring apparatus of claim 3, wherein the leakage determination unit:
- generates the leakage signal when the sum of the weights is 10 or more by assigning a weight of 2 when a leak is determined based on the audio data, assigning a weight of 6 when a leak is determined based on the pressure data, assigning a weight of 1 when a leak is determined based on the image data, assigning a weight of 4 when a leak is determined based on the displacement data, assigning a weight of 6 when a leak is determined based on the infrared data, and assigning a weight of 1 when a leak is determined based on the ultrasonic data.

5. The remote monitoring apparatus of claim 3, wherein the self-learning unit:
- generates the deep learning solution to determination of a leakage of the air valve by performing deep learning using the audio data, the pressure data, the image data, the displacement data, the infrared data, and the ultrasonic data by means of machine learning software using a neural network compiler that operates in the MCU.

6. The remote monitoring apparatus of claim 3, wherein the deep learning solution:
- is stored in the deep learning solution storage unit of the MCU and forms a distributed cloud.

7. The remote monitoring apparatus of claim 1, wherein the operator terminal comprises:
- a terminal reception unit configured to receive the leakage signal generated by the leakage determination unit and data analyzed by the data analysis unit;
- a screen output unit configured to output the leakage signal and the data, received by the terminal reception unit, as images; and
- an audio output unit configured to output the leakage signal, received by the terminal reception unit, as audio data.

8. A remote monitoring method for an air valve for semiconductor equipment, the remote monitoring method comprising:
- a first step of sensing each of audio data, pressure data, image data, displacement data, infrared data, and ultrasonic data of the air valve and transmitting it to a data collection unit of an inspection device;
- a second step of preprocessing each of the audio data, the pressure data, the image data, the displacement data, the infrared data, and the ultrasonic data, sensed at the first step, in a data analysis unit of the inspection device;
- a third step of dividing the audio data, the pressure data, the image data, the displacement data, the infrared data, and the ultrasonic data, preprocessed at the second step, in the data analysis unit;
- a fourth step of analyzing each of the audio data, the pressure data, the image data, the displacement data, the infrared data, and the ultrasonic data, divided at the third step, in the data analysis unit;
- a fifth step of storing the audio data, the pressure data, the image data, the displacement data, the infrared data, and the ultrasonic data, analyzed at the fourth step, in a data storage unit of the inspection device;
- a sixth step of generating a deep learning solution to determination of a leakage of the air valve based on the audio data, the pressure data, the image data, the displacement data, the infrared data, and the ultrasonic data, stored at the fifth step, in a self-learning unit of the inspection device;
- a seventh step of storing the deep learning solution, generated at the sixth step, in a deep learning solution storage unit of the inspection device;
- an eighth step of determining a leak of the air valve based on each of the audio data, the pressure data, the image data, the displacement data, the infrared data, and the ultrasonic data, analyzed at the fourth step, by using the deep learning solution stored at the seventh step, and generating a leakage signal when the sum of the weights is 10 or more by assigning a weight of 2 when a leak is determined based on the audio data, assigning a weight of 6 when a leak is determined based on the pressure data, assigning a weight of 1 when a leak is determined based on the image data, assigning a weight of 4 when a leak is determined based on the displacement data, assigning a weight of 6 when a leak is determined based on the infrared data, and assigning a weight of 1 when a leak is determined based on the ultrasonic data;
- a ninth step of transmitting the leakage signal, generated at the eighth step, to a management server and an operator terminal; and
- a tenth step of outputting the leakage signal transmitted at the ninth step and the data analyzed at the fourth step as images in a screen output unit of the operator terminal and as audios in an audio output unit.

* * * * *